United States Patent
Axenbeck et al.

(10) Patent No.: US 7,262,606 B2
(45) Date of Patent: Aug. 28, 2007

(54) METHOD OF ARC DETECTION

(75) Inventors: Sven Axenbeck, Neuenburg (DE);
Markus Bannwarth, Freiburg (DE);
Martin Steuber, Buggingen (DE);
Alfred Trusch, Breisach (DE); Lothar Wolf, Sasbach (DE); Peter Wiedemuth, Herbolzheim (DE); Gerhard Zähringer, Freiburg (DE)

(73) Assignee: Huettinger Elektronik GmbH + Co. KG, Freiburg (DE)

( * ) Notice: Subject to any disclaimer, the term of this patent is extended or adjusted under 35 U.S.C. 154(b) by 0 days.

(21) Appl. No.: 11/277,460

(22) Filed: Mar. 24, 2006

(65) Prior Publication Data

US 2006/0213761 A1    Sep. 28, 2006

Related U.S. Application Data

(60) Provisional application No. 60/675,853, filed on Apr. 29, 2005.

(30) Foreign Application Priority Data

Mar. 26, 2005   (EP)   ................................. 05006680

(51) Int. Cl.
*G01R 31/08* (2006.01)
(52) U.S. Cl. ..................... 324/536; 324/76.76
(58) Field of Classification Search ............. 324/76.76, 324/536, 460
See application file for complete search history.

(56) References Cited

U.S. PATENT DOCUMENTS

| | | | |
|---|---|---|---|
| 6,332,961 B1 * | 12/2001 | Johnson et al. | ........ 204/192.13 |
| 6,420,863 B1 * | 7/2002 | Milde et al. | ............. 324/76.76 |
| 6,772,643 B2 * | 8/2004 | Eguchi et al. | ........... 73/861.28 |
| 6,860,973 B2 | 3/2005 | Willms et al. | |
| 7,219,023 B2 * | 5/2007 | Banke et al. | .................. 702/58 |
| 2006/0049831 A1 * | 3/2006 | Anwar et al. | ................ 324/536 |
| 2007/0073498 A1 * | 3/2007 | Winterhalter et al. | ......... 702/64 |

FOREIGN PATENT DOCUMENTS

| | | |
|---|---|---|
| DE | 19703791 | 8/1998 |
| DE | 10154229 | 5/2003 |
| EP | 1 441 576 | 7/2004 |
| WO | WO99/14394 | 3/1999 |

OTHER PUBLICATIONS

Rogers et al., "RF Arc Detection using Harmonic Signals", 16th IEEE/NPSS Symposium on Fusion Engineering, Champaign, IL 1995 (Submitted).

European search report from priority application No. EP 05 006 680, Oct. 2005.

* cited by examiner

*Primary Examiner*—Walter Benson
(74) *Attorney, Agent, or Firm*—Fish & Richardson P.C.

(57) ABSTRACT

New methods are used for detecting arcs in a plasma process that is fed by, for example, a freely oscillating AC generator with an output signal of the AC generator for supplying power. The method includes measuring or determining a reference value that is based on a time response of the output signal or of an internal signal of the AC generator relating to the output signal. The methods also include comparing the reference value with a threshold value and detecting an arc when a predetermined result of the comparison is obtained.

20 Claims, 2 Drawing Sheets

METHOD OF ARC DETECTION

CROSS REFERENCE TO RELATED APPLICATION

This application is a continuation of and claims priority under 35 U.S.C. §119 to European Application No. 05 006 680.2, filed on Mar. 26, 2005 and to U.S. Application No. 60/675,853, filed on Apr. 29, 2005. Both of these applications are incorporated by reference herein in their entirety.

TECHNICAL FIELD

The invention relates to methods for detecting arcs in a plasma process that is fed by an AC generator with an output signal of the AC generator.

BACKGROUND

The coating of substrates, for example glass surfaces, through sputtering/cathode sputtering in plasma processes, both in a reactive and conventional manner, is known, for example, from architecture glass coating. To this end, a plasma is generated by a current or voltage source, which removes material from a target, the material being deposited on the substrate, for example the glass pane. Before depositing, the atoms may bond to gas atoms or molecules in a reactive process, depending on the desired coating.

Medium frequency (MF) generators are frequently used, for example, in reactive processes, and are usually operated at a frequency of about 10 to 500 kHz. MF generators may be so-called freely oscillating MF generators or they may be MF generators with a fixed frequency. The freely oscillating MF generators usually include a closed-loop controlled or uncontrolled DC voltage, that is, the intermediate circuit voltage, which is generated from a single or multi-phase voltage of a mains power supply. The intermediate circuit voltage is converted into a medium frequency (MF) AC voltage (for example, about 10-500 kHz) using an inverter (for example, a bridge circuit). The MF output power signal is connected to an oscillating circuit, which is excited to oscillate. The inverter is thereby operated in such a manner that the oscillating circuit is operated close to the resonance frequency. The oscillating circuit may be a series oscillating circuit or a parallel oscillating circuit. A series oscillating circuit is excited by an output power signal with a voltage source characteristic, whereas the parallel circuit is excited with an output power signal with current source characteristic. To generate a current source characteristic from the intermediate circuit voltage, which usually has voltage source characteristics, chokes with sufficiently large inductance are connected in series with the inverter. The MF power is usually decoupled at the coil of the oscillating circuit and connected to two electrodes in a coating chamber of a coating system to permit plasma generation in the coating chamber. Decoupling may be effected using an output transformer that provides galvanic separation from the mains. The electrodes of an MF excitation system alternately operate as anode and cathode. The resonance frequency of the oscillating circuit depends on the impedance of the plasma. To ensure that the inverter is always operated close to the resonance frequency, the controller of the inverter monitors the MF output power signal. For example, such an arrangement is shown in DE 101 54 229 A1, which describes a means for closed-loop control of a plasma impedance.

In particular, in reactive processes, arcing may occur with MF generators, so-called micro-arcs, which are often automatically eliminate with the subsequent voltage reversal or at least after a few periods. Arcs of higher energy and longer duration may also occur. Arcs are typically detected by searching the output voltage for a voltage drop or by searching the output current for a current increase. Alternatively, an arc may be detected based on a difference between the currents to the individual electrodes. The user can set a limit value for detecting arcs in conventional systems. The effective current and voltage values are measured for the detection. In such a measurement, the magnitude of the voltage values and current values is integrated over the period to prevent zero crossings from being detected as voltage drops.

When MF generators are used in the semi-conductor production process, in particular, for producing flat panel displays FPD, the generators meet higher demands in that arcs must be detected within a few μs.

SUMMARY

In one general aspect, methods are used for detecting arcs in a plasma process in a plasma chamber that is fed by an AC generator with an output signal of the AC generator for supplying power to a plasma process. The methods include determining a reference value that is based on a time response of the output signal or of an internal signal of the AC generator related to the output signal, comparing the reference value with a threshold value, and indicating the presence of an arc (or that an arc has been detected) if a predetermined result of the comparison is obtained. Determining the reference value includes determining a duration of half waves of the output signal or of the internal signal.

In general, a sudden or a considerable change in impedance within the plasma chamber is an indication that an arc has occurred within the plasma process in the plasma chamber. This impedance change can be detected by determining the reference value. Arcs are detected more effectively using this method.

Implementations can include one or more of the following features. For example, the methods can include interrupting the power supply to the plasma process when an arc is detected. Interrupting the power supply to the plasma process can include interrupting for a predeterminable time period.

The duration of the half wave can be determined by detecting the zero crossings of the output signal or of the internal signal, and by determining the time difference between two zero crossings.

The reference value can be determined by determining (for example, by measuring or calculating) the duration of the present half wave, a difference between two half wave durations, or a difference between a present half wave duration and a previous half wave duration. The reference value can also be determined using several half wave durations, or using a weighted average value of previous half wave durations.

The threshold value can be fixedly predetermined, or can be determined in dependence on the plasma process.

The methods can include determining the period of the output signal or of the internal signal, wherein the threshold value is determined in dependence on the period.

In another general aspect, a plasma excitation arrangement includes an AC generator that can be connected to a plasma process, a signal monitoring means coupled to the AC generator for monitoring a time response of an output signal of the AC generator or of an internal signal of the AC generator, a reference value determining means connected to the signal monitoring means and to a comparator, a threshold value presetting means connected to the comparator, and a means for generating a shut-down signal that is connected to the comparator. The reference value determining means is suitable for detecting the duration of the half waves of the output signal or the internal signal.

Implementations can include one or more of the following features. For example, the plasma excitation arrangement can include a control means for controlling the AC generator, wherein the reference value determining means and the comparator are disposed in the control means.

The signal monitoring means can be designed as a comparator circuit and the reference value determining means is designed as a processor. The reference value determining means can be designed as a digital signal processor.

In another general aspect, a plasma excitation arrangement includes an AC generator, a signal monitoring device, a reference value device, a threshold value device, a comparator, and a controller. The AC generator produces an output signal that can be connected to a plasma process and the AC generator includes an internal signal. The signal monitoring device is coupled to the AC generator and produces a time response of the output signal of the AC generator or of the internal signal of the AC generator. The time response includes a duration of half waves of the output signal of the AC generator or of the internal signal of the AC generator. The reference value device has an input connected to the signal monitoring device to receive the time response and the reference value device produce a reference value based on the time response. The threshold value device produces a threshold value. The comparator has a first input connected to reference value device to receive the reference value. The comparator has a second input connected to the threshold value device to receive the threshold value. The comparator compares the reference value and the threshold value and produces a shut-down signal depending on the result of the comparison. The controller is coupled to receive an output of the comparator and is connected to the AC generator. The controller sends the shut-down signal to the AC generator.

Implementations can include one or more of the following features. For example, the AC generator can include an inverter that produces the internal signal and that receives the shut-down signal.

The method for detecting arcs in a plasma process and the plasma excitation arrangement provides for even faster arc detection.

The reference value can be determined by taking into consideration the time response, the reference value is compared with a threshold value, and an arc is detected when a predetermined result of the comparison is obtained. An output signal is monitored, plasma impedance changes are concluded from the monitoring, and the plasma process is adjusted, if required. The method for detecting arcs permits rapid detection of arcs in the plasma process and reaction thereto, if desired. An output signal of an inverter of the AC generator could, for example, be used as an internal signal related to the output signal, which is fed to an output oscillating circuit of the AC generator. The frequency, the period, and/or the frequency spectrum of the output signal or of the internal signal related to the output signal can be used as the value associated with the time response. The new methods for detecting arcs permit extremely rapid arc detection. It is, in particular, possible to detect an arc within half a period duration, for example, within 40 µs.

In certain implementations, the power supply to the plasma process can be interrupted, for example, for a predeterminable time period when an arc has been detected. The residual energy in the output oscillating circuit can thereby die down and no additional energy is supplied to the arcs. The arcs are therefore rapidly eliminated causing less damage to the plasma chamber. The power supply to the plasma process can be interrupted by short-circuiting the lines forming the input of an inverter of the AC generator or connecting them with a low impedance. This is possible when the current from an intermediate circuit voltage to an inverter is limited which is often achieved for example by providing chokes in MF generators having a parallel oscillating circuit at their outputs. Alternatively, the inverter can be connected in such a manner that the current path from the power supply unit including at least two lines of different potential is short-circuited or connected with a low impedance.

In certain implementations, the duration of half waves of the output signal is determined as a value associated with the time response of the output signal or of the internal signal. Zero crossing detection of the output voltage is anyway realized in freely oscillating MF AC generators. The zero crossing detection is used for controlling an inverter. This zero crossing detection can be used to detect arcs within the duration of one half wave.

It is feasible to determine the duration of the half waves by detecting the zero crossings of the output signal or of the internal signal and determining the temporal difference between two zero crossings. Alternatively, the duration of the half waves can be determined from the period or the frequency of the output signal. It is also feasible to determine the duration between two maxima of the output signal. The time interval between a zero crossing and the subsequent zero crossing can be determined in a particularly simple manner. The polarity of the inverter is reversed in correspondence with the next zero crossing, and the dead times of the inverter circuit are accounted for by beginning the reversion of polarity after a time that is slightly shorter than the time previously measured for the duration of the half wave. At the same time, the actual zero crossing of the voltage is monitored again and the actual time until the zero crossing is determined again. In case of slow impedance changes, the period from zero crossing to zero crossing also changes slowly. A sudden considerable change, mainly a reduction in time between one zero crossing and the next zero crossing is a safe indication of the presence of an arc in the plasma. For this reason, it is particularly advantageous to determine the duration of the instantaneous half wave as reference value.

Alternatively, the difference or the relationship between two half wave durations can be determined as a reference value, for example, of the present half wave duration and the previous half wave duration. When several half wave durations are determined, the period can also be determined and a value normalized to the period can be determined as reference value.

To prevent arc detection for situations in which several permitted impedance fluctuations occur, several half wave durations can be taken into consideration for determining the reference value, for example, a preferably weighted mean value of previous half wave durations.

The methods can be performed in a particularly simple manner with simple calculation by predetermining one value as threshold value.

Reliable arc detection is obtained when the threshold value is determined in dependence on the plasma process. It is thereby possible to prevent detection of an arc during admissible impedance fluctuations, thus preventing unnecessary interruption of the plasma process.

The threshold value can be adjusted in a particularly simple manner in dependence on the plasma process when the period of the output signal or of the internal signal is determined, and the threshold value is determined in dependence on the period. In case of a freely oscillating AC generator, the frequency, and hence, the period of the output signal are a measure of the impedance of the plasma process. The period changes with an impedance change and therefore with the occurrence of an arc. The last determined period or a period averaged from a predeterminable number of previous periods can be used to determine the occurrence of an impedance change. The period of an output signal can, in particular, be permanently detected and updated. It is also feasible to use a standardized period of the output signal or of the internal signal. The period can also be determined from a predeterminable number of detected half wave durations.

In one general aspect, a plasma excitation arrangement includes a, for example, freely oscillating AC generator that can be connected to a plasma process, that is, electrodes of a plasma chamber, and a signal monitoring means for monitoring the time response of an output signal or of an internal signal of the AC generator. The plasma excitation arrangement includes a reference value determining means that is connected to the signal monitoring means and to a comparator, and a threshold value presetting means that is also connected to the comparator. The comparator is connected to or includes a means for generating a shut-down signal, for example, of the AC generator. An arrangement of this type permits rapid detection of arcs in a plasma process and rapid interruption of the power supply to the plasma process. The time response can, in particular, be monitored by detecting the zero crossings of the output signal or of the internal signal. Alternatively, the frequency or period duration of the output signal or of the internal signal can be monitored. The energy supply to the plasma chamber can be interrupted by the shut-down signal.

In various implementations, the plasma excitation arrangement includes a control means for open-loop controlling the AC generator, wherein the reference value determining means and the comparator can be disposed in the control means.

In certain implementations, the signal monitoring means is designed as comparator circuit and the reference value determining means is designed as a processor, for example, as a digital signal processor.

Further features and advantages can be extracted from the following description, the drawings, and the claims. The individual features may be realized individually or collectively in arbitrary combination in a variant of the invention. Exemplary implementations are schematically shown in the drawing and are explained in more detail below with reference to the figures of the drawing.

DETAILED DESCRIPTION

Figure 1:
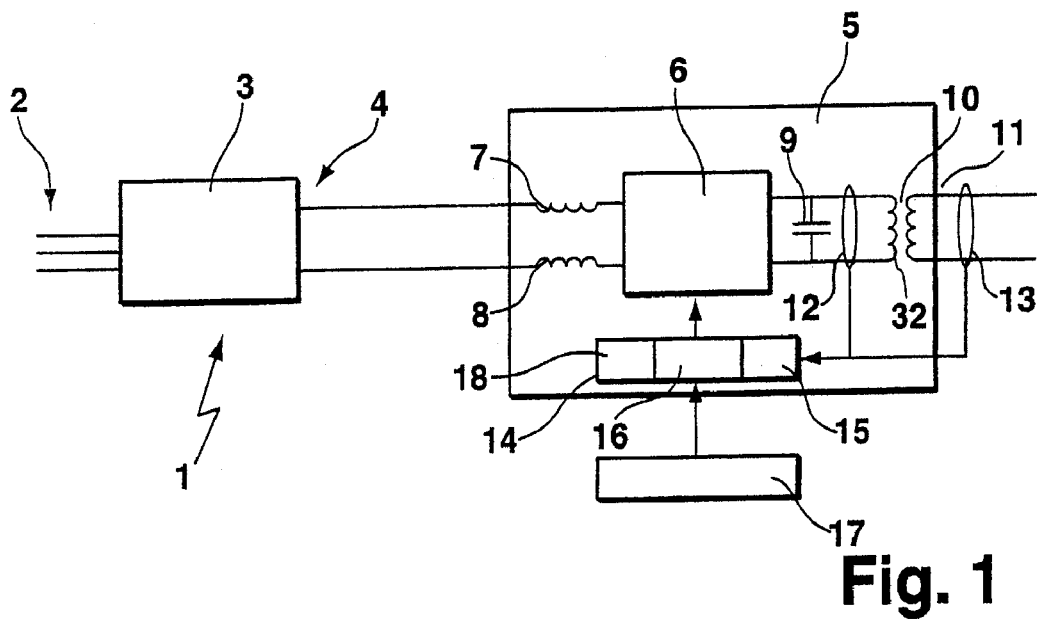
FIG. 1 is a schematic view of a plasma excitation arrangement.

FIG. 1 shows a plasma excitation arrangement 1 that can be connected via a mains connection 2 to a multi-phase input voltage. A DC current supply 3 is connected to the multi-phase input voltage via the mains connection 2 to generate an intermediate circuit voltage 4 at its output. To this end, the DC current supply 3 may include a mains rectifier and a DC/DC converter.

An AC generator 5 designed as medium frequency (MF) unit is fed with the intermediate circuit voltage 4. In particular, an inverter 6 is connected to the intermediate circuit voltage 4 via chokes 7, 8. An AC voltage is generated in the inverter 6. This AC voltage is present in the form of an internal signal at the output of the inverter 6. Galvanic separation is realized by an output transformer 10 that transforms the AC voltage of the inverter 6 into an output signal 11 at the output of the AC generator 5. A capacitor 9 and the leakage inductance of the output transformer 10 produce a parallel resonance circuit that represents an output oscillating circuit. The output signal 11 may be supplied to a plasma chamber (not shown). In general, and as further discussed below, a sudden or a considerable change in impedance within the plasma chamber is an indication that an arc has occurred within the plasma process in the plasma chamber. This impedance change can be detected by determining a reference value that is based on a time response of the output signal 11 of the AC generator 5 or of the internal signal that supply or feed the plasma chamber. The time response is a measure of time taken from the output signal 11 or from the internal signal, for example, it is a reduction in time between one zero crossing and the next zero crossing of the output signal 11 of the AC generator 5 or of the internal signal.

The internal signal in the inverter 6 and/or the output signal 11 of the generator 5 can be detected with signal monitoring means 12, 13. The signal monitoring means 12, 13 are connected to a control means 14. The control means 14 includes a reference value determining means 15 to determine the reference value from the determined internal signal or the output signal 11, and, as discussed above, the reference value is associated with the time response of the signals. This reference value is compared in a comparator 16 with a threshold value that is predetermined by a threshold value predetermining means 17. The comparator 16 is connected to a controls means 18 that generates a shut-down signal in dependence on the result of the comparison performed by the comparator 16. The shut-down signal can interrupt the energy supply to the plasma chamber.

Figure 2A:
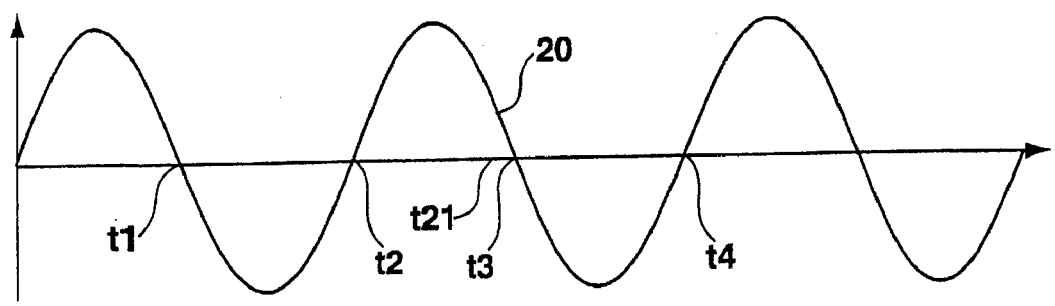
FIG. 2a is a graph of an output signal response without occurrence of an arc.

FIG. 2a exemplarily shows the time response of an output signal 20 of the AC generator 5. The signal monitoring means 13 detects the zero crossings t1-t4. A comparator generates, for example, a flank or a level change of a signal with each zero crossing t1, t2, t3, t4 of the monitored signal in the signal monitoring means 13. The time distance from a zero crossing t1-t4 to the next zero crossing t1-t4 is determined. The polarity of the inverter 6 is reversed in correspondence with the next zero crossing, and the dead times of the circuit within the inverter 6 are accounted for by starting the reversion of polarity of the inverter 6 after lapse of a time that is slightly shorter than the duration measured for the preceding half wave. For example, as shown in FIG. 2a, reversion of polarity of the inverter 6 occurs at the time t21. At the same time, the actual zero crossing t1-t4 of the output signal 20, in particular, of the output voltage is monitored again and the actual time until the zero crossing t1-t4 is determined again. In case of slow impedance changes within the plasma in the plasma chamber, the time from zero crossing t1-t4 to zero crossing t1-t4 also changes slowly.

Figure 2B:
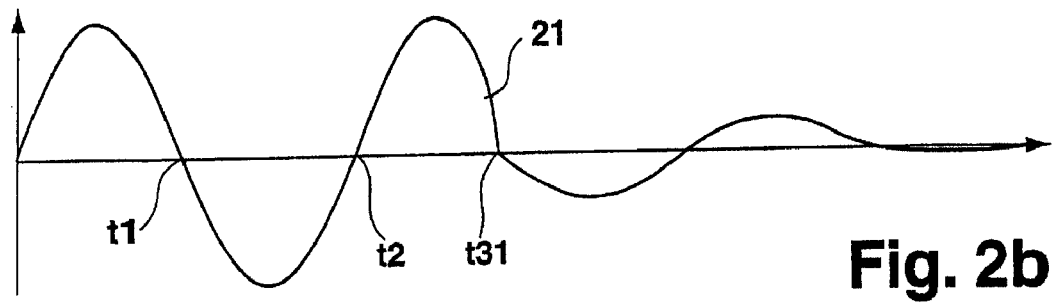
FIG. 2b is a graph of an output signal response with occurrence of an arc.

However, referring to FIG. 2b, a sudden or a considerable change of the plasma impedance in the plasma chamber may present itself as a reduction in time between one zero crossing and the next zero crossing, such as, for example, from t2 to t31 of the output signal 21 from the AC generator 5. Such a reduction in time is a safe indication that an arc has occurred in the plasma process within the plasma chamber.

The threshold value starting from which an arc shall be detected, can be adjusted or predetermined by the threshold value predetermining means 17.

Moreover, the reference value determining means 15 uses the measured duration of a half wave as a reference value that the comparator 16 compares with a threshold value. Alternatively, the difference $\Delta t=(t3-t2)-(t2-t1)$ (FIG. 2a) or $\Delta t=(t31-t2)-(t2-t1)$ (FIG. 2b) can be calculated and used as the reference value. Therefore, if the difference $\Delta t$ differs from 0 by more than a predetermined threshold value (such as in FIG. 2b), this is indicative of the presence of an arc in the plasma.

The reference values can be normalized to the period duration T. The period duration T may thereby be permanently calculated to prevent that "permitted" impedance fluctuations result in the detection of an arc.

Since digital detection of zero crossings is facilitated with the use of a comparator circuit and flanks of microprocessors, for example, digital signal processors, the zero crossing can be evaluated in a relatively simple and fast manner, the control means 14 can be a digital control means, which is advantageous in connection with arc detection.

Figure 3:
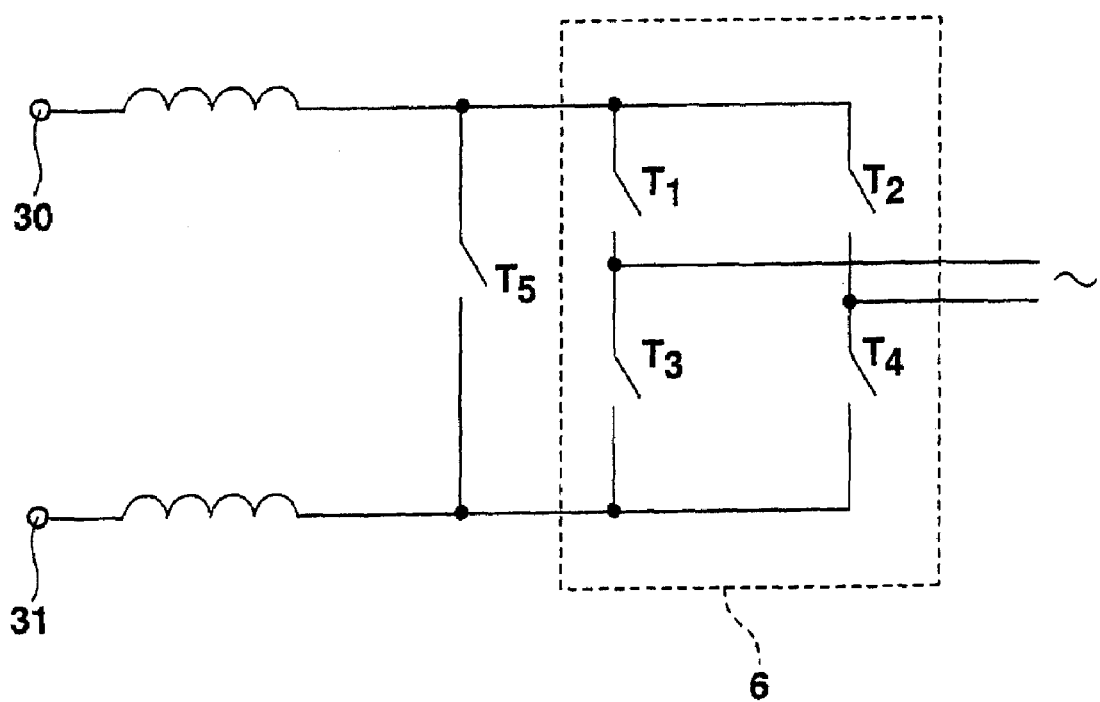
FIG. 3 is a detailed view of an inverter of the plasma excitation arrangement of FIG. 1.

FIG. 3 shows a detailed view of one implementation of an inverter 6. The inverter 6 includes a full bridge that consists of four switching elements T1-T4 that may be designed as transistors. These switching elements T1-T4 are controlled by the control means 14. In this way, different scenarios are feasible to interrupt the power supply into the plasma chamber. On the one hand, the switching elements T1 and T3 can be connected in a conducting manner to short-circuit the current from the DC current supply 3, or the terminals 30, 31 can be short-circuited or be connected with a small resistance. On the other hand, the switching elements T2 and T4 may be connected through to obtain the same effect.

When the switching elements T1, T2, or T3, T4 or all of the switching elements T1-T4 are controlled in such a manner that they are conducting, the output oscillating circuit, which consists of the capacitor 9 and a primary inductance 32 of the output transformer 10, is short-circuited to thereby interrupt the power supply to the plasma chamber.

To be able to interrupt the power supply, a switching element T5 may be disposed between the terminals 30, 31 or at the input of the inverter 6. The switching elements T1-T5 can be controlled by the control means 14, in particular, by the means 18 for generating a shut-down signal.

OTHER EMBODIMENTS

It is to be understood that while the invention has been described in conjunction with the detailed description thereof, the foregoing description is intended to illustrate and not limit the scope of the invention, which is defined by the scope of the appended claims. Other aspects, advantages, and modifications are within the scope of the following claims.

What is claimed is:

1. A method for detecting arcs in a plasma process that is fed by an AC generator with an output signal of the AC generator for supplying power, the method comprising:
   determining a reference value that is a measure of time based on a time response and a duration of half waves of the output signal or of an internal signal of the AC generator,
   comparing the reference value with a threshold value, and detecting an arc if a predetermined result of the comparison is obtained.

2. The method of claim 1, wherein determining the reference value includes measuring the reference value.

3. The method of claim 1, further comprising interrupting the power supply to the plasma process when an arc is detected.

4. The method of claim 3, wherein interrupting the power supply to the plasma process includes interrupting for a predeterminable time period.

5. The method of claim 1, wherein determining the duration of the half wave includes:
   detecting the zero crossings of the output signal or of the internal signal, and
   determining the time difference between two zero crossings.

6. The method of claim 1, wherein determining the reference value includes measuring the duration of the present half wave.

7. The method of claim 1, wherein determining the reference value includes determining a difference between two half wave durations.

8. The method of claim 7, wherein determining the reference value includes determining a difference between a present half wave duration and a previous half wave duration.

9. The method of claim 7, wherein determining the reference value includes using several half wave durations.

10. The method of claim 7, wherein determining the reference value includes using a weighted average value of previous half wave durations.

11. The method of claim 1, wherein determining the reference value includes determining a difference between a present half wave duration and a previous half wave duration.

12. The method of claim 1, wherein the threshold value is fixedly predetermined.

13. The method of claim 1, wherein the threshold value is determined in dependence on the plasma process.

14. The method of claim 1, further comprising determining the period of the output signal or of the internal signal, wherein the threshold value is determined in dependence on the period.

15. A plasma excitation arrangement comprising:
   an AC generator that can be connected to a plasma process,
   a signal monitoring means coupled to the AC generator for monitoring a time response of an output signal of the AC generator or an internal signal of the AC generator,
   a reference value determining means connected to the signal monitoring means and to a comparator to produce a reference value that is a measure of time based on the time response including detecting duration of half waves of the output signal or the internal signal, a threshold value presetting means connected to the comparator, and a means for generating a shut-down signal that is connected to the comparator.

16. The plasma excitation arrangement of claim 15, further comprising a control means for controlling the AC generator, wherein the reference value determining means and the comparator are disposed in the control means.

17. The plasma excitation arrangement of claim 15, wherein the signal monitoring means is designed as a comparator circuit and the reference value determining means is designed as a processor.

18. The plasma excitation arrangement of claim 15, wherein the reference value determining means is designed as a digital signal processor.

19. A plasma excitation arrangement comprising:

an AC generator that produces an output signal that can be connected to a plasma process and includes an internal signal, a signal monitoring device coupled to the AC generator to monitor a time response of the output signal of the AC generator or of the internal signal of the AC generator including a duration of half waves of the output signal of the AC generator or of the internal signal of the AC generator, a reference value device connected to the signal monitoring device to produce a reference value based on the time response, a threshold value device that produces a threshold value at an output, a comparator connected to the reference value device to receive the reference value and connected to the threshold value device to receive the threshold value, wherein the comparator compares the reference value and the threshold value and produces a shut-down signal depending on the result of the comparison, and a controller coupled to the comparator and connected to the AC generator, wherein the controller sends the shut-down signal to the AC generator.

20. The plasma excitation arrangement of claim 19, wherein the AC generator includes an inverter that produces the internal signal and that receives the shut-down signal.

* * * * *